United States Patent [19]

Kohno

[11] Patent Number: 5,391,899
[45] Date of Patent: Feb. 21, 1995

[54] COMPOUND SEMICONDUCTOR DEVICE WITH A PARTICULAR GATE STRUCTURE

[75] Inventor: Yasutaka Kohno, Itami, Japan

[73] Assignee: Mitsubishi Denki Kabushiki Kaisha, Tokyo, Japan

[21] Appl. No.: 164,998

[22] Filed: Dec. 10, 1993

Related U.S. Application Data

[63] Continuation of Ser. No. 933,238, Aug. 21, 1992, abandoned.

[30] Foreign Application Priority Data

Oct. 29, 1991 [JP] Japan .................... 3-313739

[51] Int. Cl.⁶ .................... H01L 29/78; H01L 29/784; H01L 29/812
[52] U.S. Cl. .................... 257/192; 257/194; 257/284
[58] Field of Search .................... 357/22 A, 16, 67, 59; 257/27, 29, 192, 194, 284

[56] References Cited

U.S. PATENT DOCUMENTS

| 4,074,300 | 2/1978 | Sakai et al. ............ 257/387 |
| 4,141,022 | 2/1979 | Sigg et al. ............ 257/384 |
| 4,873,558 | 10/1989 | Antreasyan et al. ............ 257/289 |
| 5,105,241 | 4/1992 | Ando ............ 257/194 |
| 5,172,197 | 12/1992 | Nguyen et al. ............ 257/194 |

FOREIGN PATENT DOCUMENTS

| 0102561 | 6/1983 | Japan ............ 257/194 |
| 61-77370 | 4/1986 | Japan . |
| 63-23366 | 1/1988 | Japan . |
| 63-174374 | 7/1988 | Japan . |
| 321032 | 1/1991 | Japan . |
| 3-179782 | 8/1991 | Japan ............ 257/192 |

Primary Examiner—Robert P. Limanek
Assistant Examiner—Wael M. Fahmy
Attorney, Agent, or Firm—Leydig, Voit & Mayer

[57] ABSTRACT

A compound semiconductor device includes a plurality of epitaxial compound semiconductor layers including an InGaAs layer as the uppermost layer disposed on a semi-insulating compound semiconductor substrate, a groove penetrating through at least the InGaAs layer, an insulating film disposed on the side surfaces of the groove and having ends extending beyond the groove, a gate electrode disposed in the groove and on the insulating film, and source and drain electrodes on the InGaAs layer at opposite sides of the groove self-aligned with the ends of the insulating film.

4 Claims, 6 Drawing Sheets

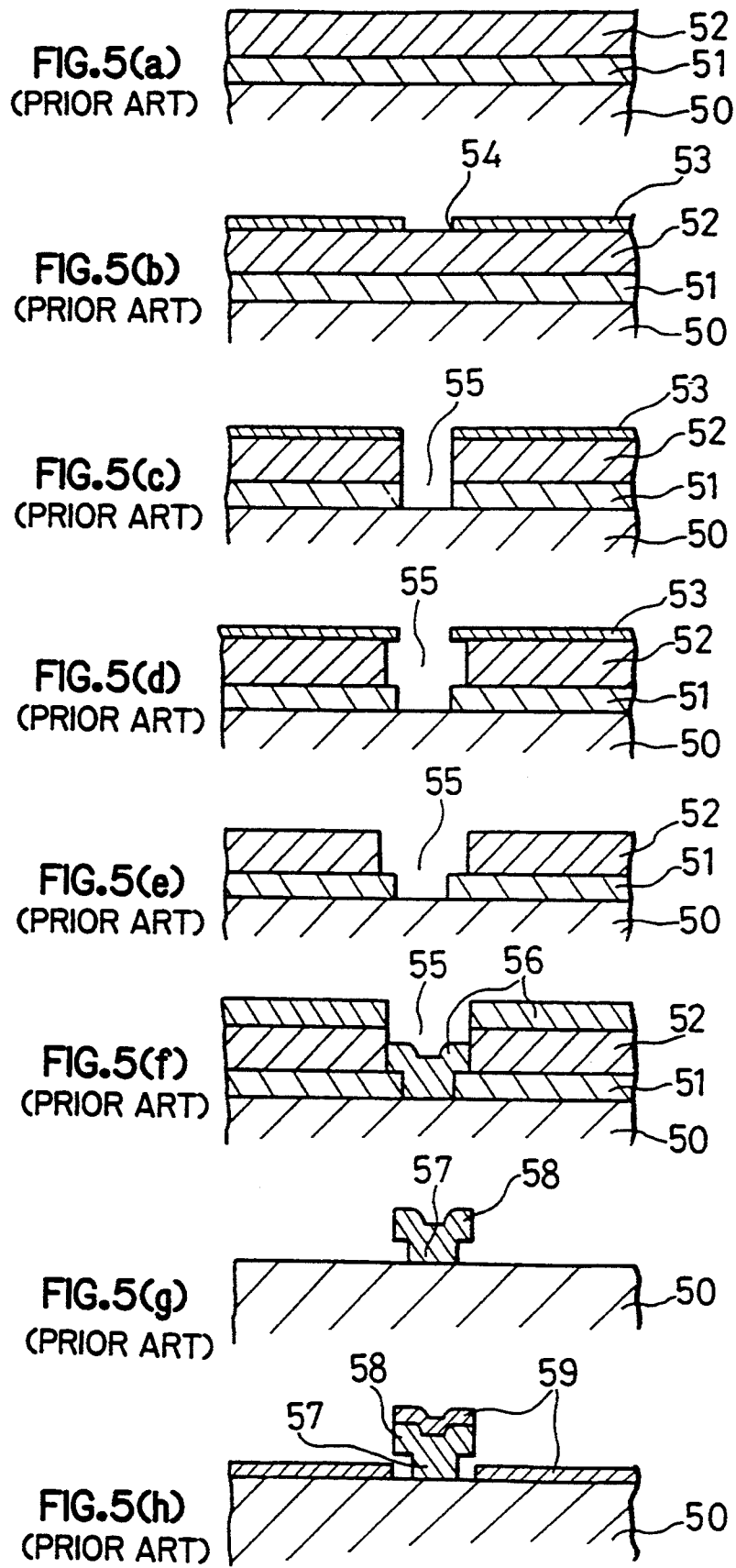

COMPOUND SEMICONDUCTOR DEVICE WITH A PARTICULAR GATE STRUCTURE

This disclosure is a continuation of application Ser. No. 07/933,238, now abandoned, filed on Aug. 21, 1992.

FIELD OF THE INVENTION

The present invention relates to field-effect compound semiconductor devices and, more particularly, to a high performance compound semiconductor device having reduced gate-to-source and gate-to-drain distance and a reduced gate resistance. The present invention also relates to a method for producing such a device.

BACKGROUND OF THE INVENTION

In a field-effect transistor like a high electron mobility transistor (hereinafter referred to as HEMT) made of a compound semiconductor, such as gallium arsenide (GaAs), a gate electrode having a short length and a low resistance is required to enhance the characteristics of the transistor. A gate electrode having a T-shaped cross-section meets this requirement and various methods for producing such a gate electrode have been proposed.

FIG. 3 is a cross-sectional view of a prior art field-effect transistor, produced with reference to a method for producing a gate electrode disclosed in Japanese Published Patent Application No. Sho. 61-77370. In FIG. 3, reference numeral 31 designates a semi-insulating GaAs substrate. A high dopant purity GaAs buffer layer 32 is disposed on the substrate 31. An n type AlGaAs layer 33 is disposed on the buffer layer 32. A high concentration n type (hereinafter referred to as n+ type) GaAs layer 34 is disposed on the AlGaAs layer 33. Ohmic electrodes 35 serving as source and drain electrodes are disposed on the n+ type GaAs layer 34 opposite to and spaced from each other by a prescribed interval. A stripe-shaped recess groove 36 penetrates a prescribed portion of the n+ type GaAs layer 34 between the ohmic electrodes 35. A gate electrode 37 having a T-shaped cross-section is disposed on the AlGaAs layer 33 which is exposed on the bottom surface of the recess groove 36. A two-dimensional electron gas layer 38 is formed in the buffer layer 32 in the vicinity of the boundary with the AlGaAs layer 33, in which electrons supplied from the AlGaAs layer 33 are stored.

FIGS. 4(a) to 4(f) are cross-sectional views of process steps for producing the field effect transistor of FIG. 3.

First of all, as shown in FIG. 4(a), a GaAs buffer layer 32, an n type AlGaAs layer 33, and an n+ type GaAs layer 34 are successively epitaxially grown on the semi-insulating GaAs substrate 31. Then, ohmic electrodes 35 are formed on the n+ type GaAs layer 34 opposite to and spaced from each other by a prescribed interval, by deposition and lift-off using a photoresist, as shown in FIG. 4(b).

Then, as shown in FIG. 4(c), on the n+ type GaAs layer 34 having the ohmic electrodes 35, a lower resist film 40 approximately 2000 angstroms thick and an upper resist film 41 approximately 1 micron thick are successively deposited. The upper resist film 41 has a high sensitivity and the lower resist film 40 has a sensitivity lower than that of the upper resist film 41.

Then, the lower and upper resist films 40 and 41 on the ohmic electrodes 35 are exposed in a stripe shape by an electron beam exposure method, forming a pattern of a gate electrode. If the amount and intensity of the electron beam are made large at the center of the gate pattern and small at the both sides of the gate pattern, both of the upper and lower resist films 41 and 40 are exposed at the center of the gate pattern while only the upper resist film 41 is exposed at the both sides of the gate pattern, resulting in the lower resist 40 and the upper resist 41 shown in FIG. 4(d).

Then, the n+ type GaAs layer 5 is etched by wet etching using the lower resist film 40 as a mask to form a recess groove 36. Thereafter, a gate metal 45 is deposited on the entire surface of the wafer as shown in FIG. 4(e).

Then, the gate metal 45 on the upper resist film 41 is removed together with the resist films 41 and 40 by a lift-off technique, resulting in a field effect transistor shown in FIG. 4(f).

According to this conventional method, the high sensitivity upper resist film and the low sensitivity lower resist film are patterned by the electron beam exposure whose amount and intensity are varied on the resist films and then the gate metal is formed by metal deposition and lift-off. Therefore, a fine T-shaped gate is formed in a simple process and an increase in the gate resistance due to a reduced gate length is suppressed, resulting in a high performance field-effect transistor even at high frequencies.

However, when the photoresist is deposited on the n+ type GaAs layer 34 in the step of FIG. 4(c), since the ohmic electrodes 35 are present, the step difference causes non-uniformity in the thickness of the photoresist, reducing the patterning precision of the photoresist. Further, in the step of FIG. 4(d), the gate-to-source distance may vary due to mask alignment error or the like, inviting variation in the characteristics of the completed devices.

FIGS. 5(a) to 5(h) are cross-sectional views in process steps for producing a field effect transistor using a production method for a gate electrode disclosed in Japanese Published Patent Application No. Hei. 3-21032.

First of all, a semiconductor substrate having an active region is prepared. Then, as shown in FIG. 5(a), a photoresist film 51 approximately 2000 angstroms thick is formed on the substrate 50 and a polyimide film 52 approximately 10000 angstroms thick is formed thereon.

As shown in FIG. 5(b), an aluminum film 53 approximately 500 angstroms thick having a stripe-shaped aperture 54 whose width corresponds to a gate length is formed on the polyimide film 52 using deposition and lift-off.

Then, the polyimide film 52 and the photoresist film 51 are etched by dry etching using an $O_2$ plasma and using the aluminum film 53 as a mask to form an aperture 55 as shown in FIG. 5(c).

Thereafter, the wafer is immersed in a mixture of ethylenediamine and hydrazine to etch away the polyimide film 52, whereby the aperture 55 of the polyimide film 52 is widened as shown in FIG. 5(d).

Then, the aluminum film 53 is etched using a solution comprising $H_3PO_4$ and $H_2O$ as shown in FIG. 5(e).

As shown in FIG. 5(f), a gate metal 56, such as Ti/Pt/Au, is deposited on the entire surface of the wafer.

Thereafter, the gate metal on the polyimide film 52 is removed together with the polyimide film 52 and the photoresist film 51 by a lift-off technique using an acetone solution, resulting in a T-shaped gate comprising a base part 57 and a head part 58 shown in FIG. 5(g). Since the head part 58 of the gate is formed utilizing selective etching of the polyimide film 52, the head part 58 does not deviate from the base part 57.

Finally, as shown in FIG. 5(h), an Au system metal 59 is deposited on the entire surface of the wafer and then the metal 59 on the semiconductor substrate 50 is alloyed with the semiconductor by annealing to form source and drain electrodes which ohmic contact with the semiconductor.

According to this conventional method, since the source and drain electrodes are formed self-alignedly with the gate electrode, the gate-to-source distance does not vary, so that the characteristics of the device do not deteriorate. In addition, the gate-to-source distance can be shorter than the precision of the mask alignment, resulting in a high performance device having a reduced gate-to-source resistance. Further, since the metal 59 deposited on the gate electrode has a lower resistivity than that of the T-shaped gate comprising the base part 57 and the head part 58, this metal 59 reduces the gate electrode resistance, enhancing the high frequency characteristic of the device.

When a field effect transistor is manufactured in accordance with the process steps shown in FIGS. 5(a) to 5(h), in order to further reduce the gate resistance to enhance the device characteristics, the metal layer 59, which is deposited on the lower T-shaped gate electrode, may be thicker. In this case, the ohmic electrodes 35, which are deposited with the metal layer 59, unfavorably become thick and may be short-circuited to the lower gate electrode 57 as shown in FIG. 6. As a result, the gate resistance cannot be sufficiently reduced. If the photoresist film 51 is made thicker to heighten the base part 57 of the T-shaped gate, the thick ohmic electrodes 35 may not be short-circuited with the gate electrode. However, since metal is accumulated perpendicular to the plane surface of the substrate during vapor deposition, it is impossible to form the photoresist film 51 thicker than the deposited gate metal 56. That is, there is a limitation to the reduction in gate resistance according to this method.

In addition, a metal deposition is required twice in the method of FIGS. 4(a)–(4f) and 5(a)–5(h), thereby complicating the production process.

SUMMARY OF THE INVENTION

An object of the present invention is to provide a compound semiconductor device with reduced a gate-to-source resistance and that can sufficiently suppress an increase in gate resistance caused by a reduction in gate length.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a compound semiconductor device comprises a semi-insulating compound semiconductor substrate, a plurality of compound semiconductor layers including an InGaAs layer as an uppermost layer, epitaxially grown on the substrate, a groove penetrating through prescribed layers of the compound semiconductor layers at least including the InGaAs layer, insulating side walls disposed on the side surfaces of the groove extending outside the groove, a gate electrode disposed on the bottom of the groove and on the internal surfaces of the insulating side walls, and source and drain electrodes disposed on the InGaAs layer at opposite sides of the groove self-alignedly with the upper ends of the insulating side walls. The gate-to-source distance can be shorter than the precision of the mask alignment and the gate-to-source resistance can be low. In addition, even when the electrode metal is thick, no short-circuiting occurs, resulting in a compound semiconductor device with a sufficiently reduced gate electrode resistance.

According to a second aspect of the present invention, in a method for producing a compound semiconductor device, a plurality of compound semiconductor layers including an InGaAs layer as an uppermost layer are epitaxially grown on a semi-insulating compound semiconductor substrate, first and second insulating films are deposited on the InGaAs layer, a photoresist pattern having an aperture at a gate electrode production position is formed on the second insulating film, the first and second insulating films are etched using the photoresist pattern as a mask, the second insulating film is selectively etched so that the aperture of the second insulating film is larger than the aperture of the first insulating film, a groove is formed by etching away a portion of the compound semiconductor epitaxially grown layers using the first insulating film as a mask, a third insulating film is deposited on the side surfaces of the first and second insulating films in the groove, the first and second insulating films are removed, and a metal is deposited so that a gate electrode is formed on the bottom of the groove and on the third insulating film while source/drain electrodes are formed on the InGaAs layer. The source/drain electrodes produce ohmic contact with the semiconductor layer in its non-alloyed state. As a result, a compound semiconductor device having a reduced gate-to-source resistance and a reduced gate electrode resistance is produced in a simple process.

BRIEF DESCRIPTION OF THE DRAWINGS

FIGS. 5(a) to 5(h) are cross-sectional views illustrating process steps for producing another prior art compound semiconductor device.

DETAILED DESCRIPTION OF THE PREFERRED EMBODIMENTS

An embodiment of the present invention will be described in detail with reference to the drawings.

Figure 1:
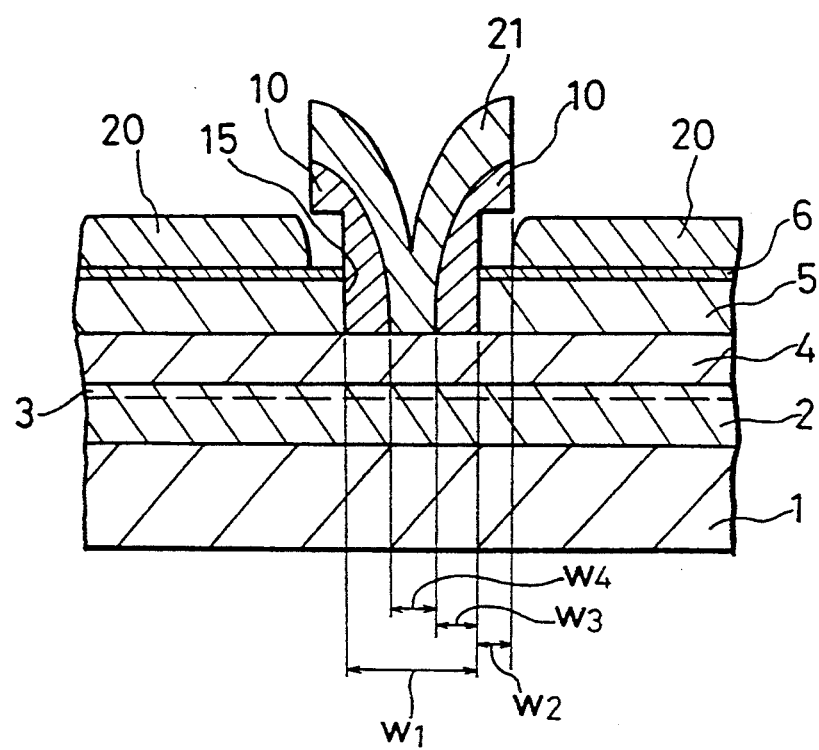
FIG. 1 is a cross-sectional view showing a compound semiconductor device in accordance with an embodiment of the present invention.

FIG. 1 is a cross-sectional view showing a compound semiconductor device in accordance with an embodiment of the present invention. In FIG. 1, a GaAs buffer layer 2 approximately 3000 angstroms thick is disposed on the semi-insulating GaAs substrate 1. An n type AlGaAs layer 4 having a thickness of approximately 400 angstroms and a carrier concentration of approximately $2 \times 10^{18}$ cm$^{-3}$ is disposed on the buffer layer 2. A two-dimensional electron gas layer 3 is formed in the buffer layer 2 in the vicinity of the boundary with the n type AlGaAs layer 4. An n type GaAs layer 5 having a thickness of approximately 1500 angstroms and a carrier concentration of approximately $8 \times 10^{18}$ cm$^{-3}$ is disposed on the n type AlGaAs layer 4. An n type InGaAs layer 6 having a thickness of approximately 500 angstroms and a carrier concentration of approximately $4 \times 10^{19}$ cm$^{-3}$ is disposed on the n type GaAs layer 5. A groove 15 0.5 micron width penetrates the n type InGaAs layer 6 and the n type GaAs layer 5. SiN films 10 are disposed on the opposite side walls of the groove 15. The upper end parts of the SiN films 10 extend outside the groove over the n type InGaAs layers 6. A gate electrode 21 is disposed on the bottom surface of the groove 15 and on the internal surfaces of the SiN films 10. Source and drain electrodes 20 are disposed on the n type InGaAs layers 6 at both sides of the groove 15, alignedly with the upper end parts of the SiN films 10.

FIGS. 2(a) to 2(h) are cross-sectional views illustrating process steps for producing the semiconductor device of FIG. 1.

Figure 2A:
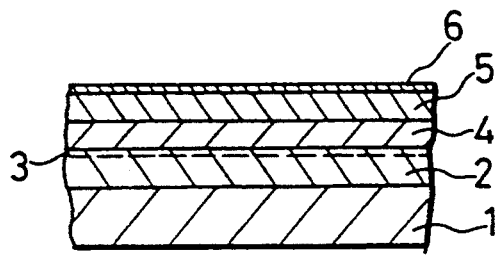
FIGS. 2(a) to 2(h) are cross-sectional views illustrating process steps for producing the compound semiconductor device of FIG. 1.

First, as shown in FIG. 2(a), a GaAs buffer layer 2 having a thickness of 3000 angstroms, an n type AlGaAs layer 4 having a thickness of 400 angstroms and a carrier concentration of $2 \times 10^{18}$ cm$^{-3}$, an n type GaAs layer 5 having a thickness of 1500 angstroms and a carrier concentration of $8 \times 10_{18}$ cm$^{-3}$ and an n type InGaAs layer 6 having a thickness of 500 angstroms and a carrier concentration of $4 \times 10^{19}$ cm$^{-3}$ are successively epitaxially grown on the semi-insulating GaAs substrate 1 by molecular beam epitaxy (MBE).

Figure 2E:
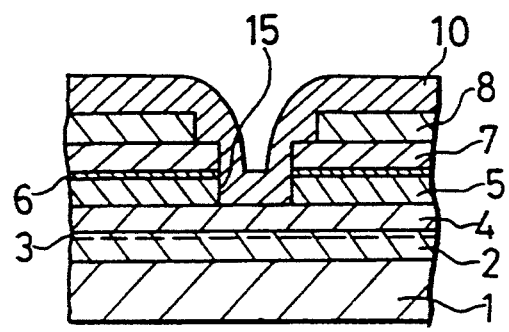
Figure 2B:
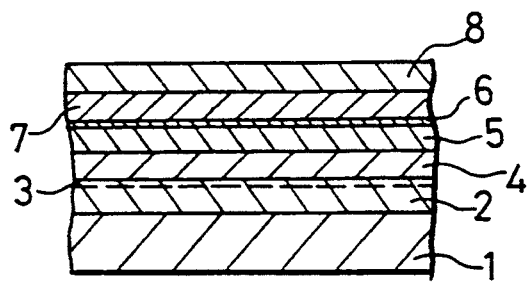

Then, as shown in FIG. 2(b), a SiO film 7 serving as a first insulating film and a SiON film 8 serving as a second insulating film are successively deposited on the n type InGaAs layer 6 to a thickness of 2000 angstroms each by plasma CVD.

Then, a photoresist film 9 is formed on the SiON film 8 and exposed and developed to form an aperture pattern of a gate electrode region. Thereafter the SiON film 8 and the SiO film 7 are anisotropically etched by reactive ion etching using a gas mixture comprising, for example CHF$_3$ and O$_2$. Thereafter, as shown in FIG. 2(c), only the SiON film 8 is selectively etched by about 0.15 to 0.2 microns by reactive ion etching using a gas mixture comprising CF$_4$ and O$_2$.

After removing the photoresist 9 by selective etching, the n type InGaAs layer 6 and the n$^+$ type GaAs layer 5 are etched by reactive etching using SiCl$_4$ gas and a gas mixture comprising CF$_4$ and O$_2$, respectively, to form a groove 15. The width of the groove 15 (w$_1$ in FIG. 1) is about 0.5 micron.

Thereafter, as shown in FIG. 2(e), a SiN film 10 serving as a third insulating film is deposited on the entire surface of the wafer to a thickness of approximately 3000 angstroms by plasma CVD.

Figure 2F:
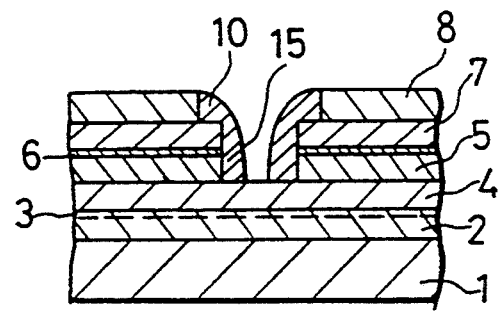
Figure 2C:
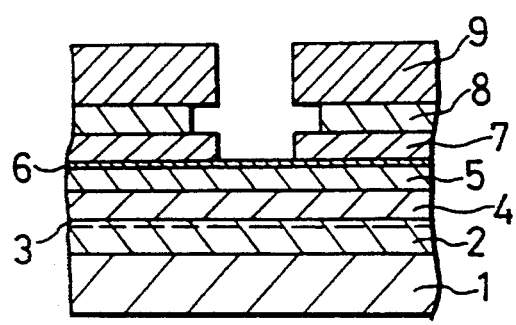

Then, as shown in FIG. 2(f), the SiN film 10 is anisotropically etched by electron cyclotron plasma etching using a gas mixture of SF$_6$ and CHF$_3$ leaving portions on the side surfaces of the SiON and SiO films 8 and 7 and on the side walls of the recess groove. The width of the SiN film 10 left on the side wall of the groove 15 (w$_3$ in FIG. 1) is about 0.2 micron and the interval between opposite SiN films 10 at the bottom of the groove 15 (w$_4$ in FIG. 1) is about 0.1 micron ($=w_1-2w_3$). This interval w$_4$ will be a gate length.

Figure 2G:
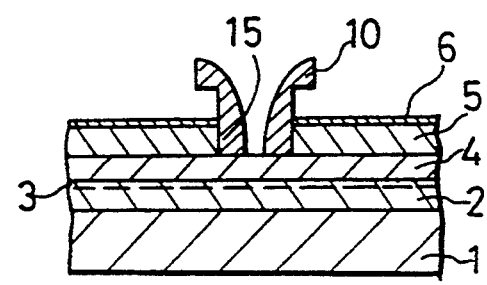
Figure 2D:
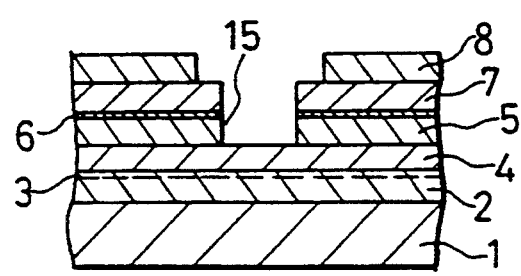
Figure 2H:
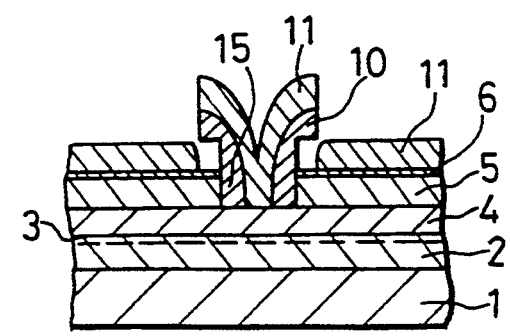
Figure 3:
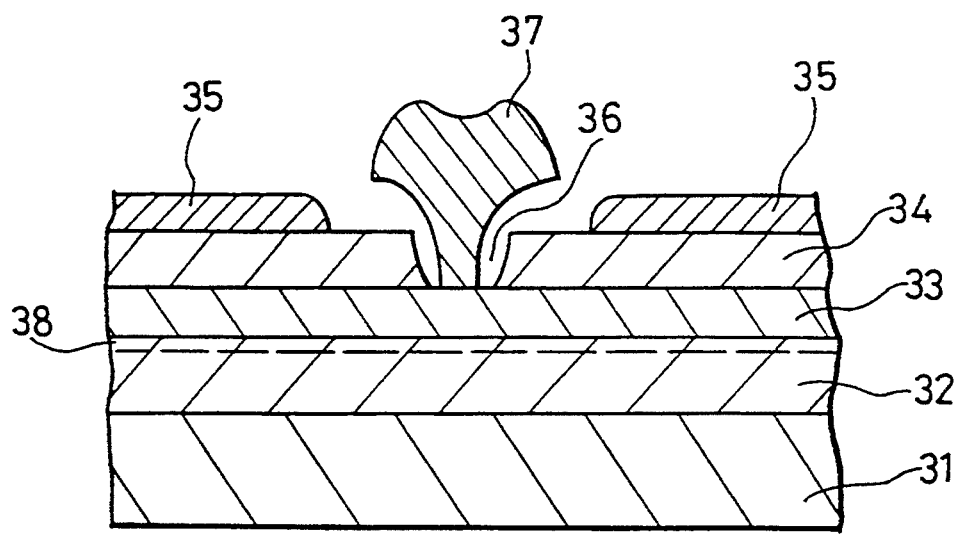
FIG. 3 is a cross-sectional view showing a prior art compound semiconductor device.
Figure 4A:
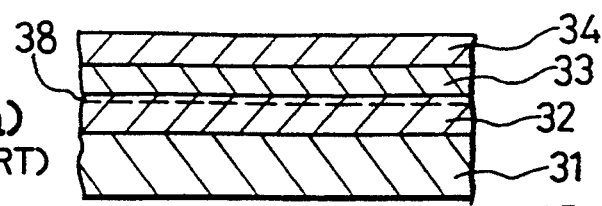
FIGS. 4(a) to 4(f) are cross-sectional views illustrating process steps for producing the compound semiconductor device of FIG. 3.
Figure 4B:
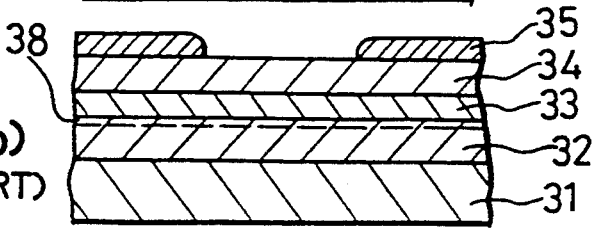
Figure 4C:
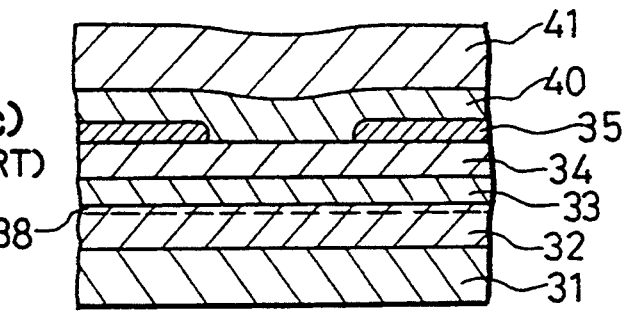
Figure 4D:
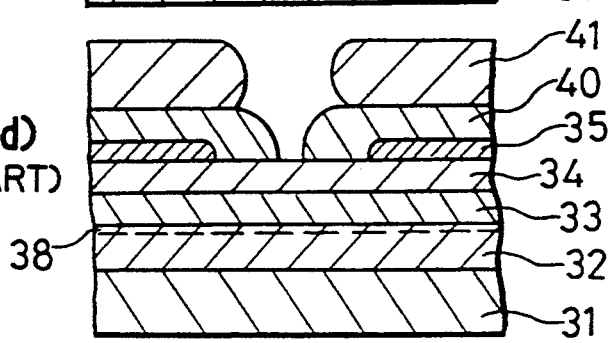
Figure 4E:
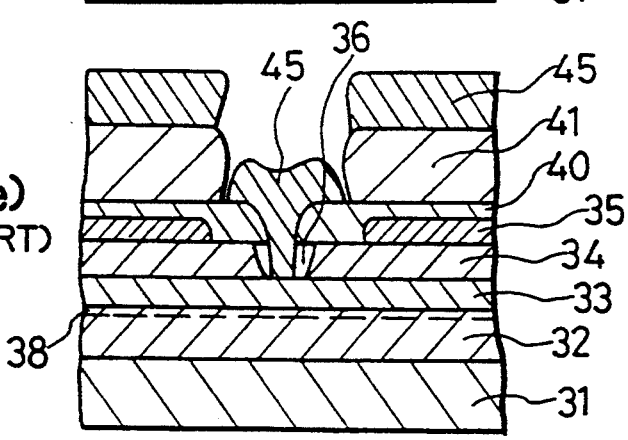
Figure 4F:
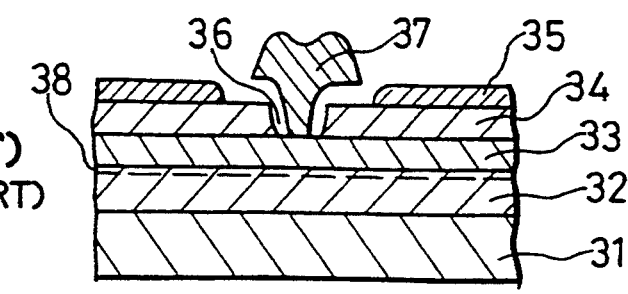

Then, the SiON film 8 and the SiO film 7 are removed by wet etching using a solution comprising water and ammonium fluoride mixed in a ratio of 30:1, as shown in FIG. 2(g). The SiN films 10 extend outside the groove 15 over the InGaAs layers 6, and the width of the upper end part of each SiN film 10 (w$_2$ in FIG. 1) is about 0.15 to 0.2 micron, which is equal to the width of the selectively etched portion of the SiON film 8 in the step of FIG. 2(c).

Finally, a Ti/Mo/Au layer 11 is deposited on the wafer so as to have a directionality perpendicular to the wafer surface, whereby source and drain electrodes and a gate electrode are formed at the same time, resulting in the field-effect transistor of FIG. 1.

In this embodiment, the gate-to-source distance is equal to the sum of the width w$_3$ of the SiN film 10 in the groove and the width w$_2$ of the upper end part. That is, the gate-to-source distance is not limited by mask alignment precision and it is precisely controlled by the selective etching of the SiON film 8 and the anisotropic etching of the SiN film 10. Although the gate-to-source distance is about 0.35 to 0.4 micron in this embodiment, it can be easily reduced by the above-described control.

In a compound semiconductor device like an HEMT, a gate electrode produces a Schottky junction with a semiconductor layer and source/drain electrodes are in ohmic contact with the semiconductor layer. When the source/drain electrodes are formed on a GaAs layer, the ohmic contact between the electrodes and the semiconductor layer is not achieved solely by depositing the electrode metal, so that annealing is carried out to alloy the metal thereby to achieve the ohmic contact. In a case where the gate electrode has already been formed, the gate metal may be damaged by the annealing. In order to avoid this, in the conventional production process shown in FIGS. 4(a)-4(f), the source/drain electrodes are formed in the step 4(b) and then the gate electrode is formed in the later step 4(e). In an embodiment of the present invention, the uppermost layer of the epitaxially grown layers, i.e., the layer on which source/drain electrodes are to be formed, comprises InGaAs. Since InGaAs has a small energy band gap, the metal deposited on the n type InGaAs layer 6 forms an ohmic electrode without being alloyed by annealing. Therefore, the annealing process can be omitted, resulting in no deterioration of the gate metal.

Figure 6:
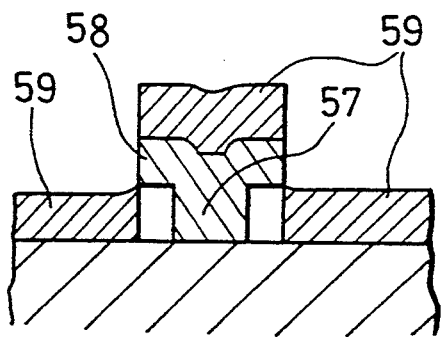
FIG. 6 is a cross-sectional view for explaining problems in the prior devices.

When the gate electrode metal is thick to reduce the gate electrode resistance, the source/drain electrodes, which are deposited at the same time, are thick. However, since the SiN films 10 are present on the rear surface of the upper end parts of the gate electrode, short-circuiting of the source/drain electrodes and the gate electrode as shown in FIG. 6 is avoided. If the thickness of the source/drain electrodes exceeds the SiN film 10 on the rear surface of the gate electrode, the source/drain electrodes may be short-circuited with the gate electrode. However, the distance between the surface of the n type InGaAs layer 6 and the upper end of the SiN film 10 on the rear surface of the gate electrode is controlled by the thicknesses of the SiO film 7 and the SiON film 8, so that the gate electrode resistance can be sufficiently reduced by making those films 7 and 8 thick.

In the present invention, the insulating side walls 10 whose upper end parts extend outside the groove 15 are formed on the side walls of the groove 15 and then the metal layer 11 is deposited using the insulating side walls 10 as a mask, whereby the gate electrode is formed on the bottom surface of the groove 15 and on the insulating side walls while the source and drain electrodes are formed on the InGaAs layers 6 self-aligned with the upper ends of the insulating side walls 10. As a result, a high performance HEMT having a short gate length, a low gate resistance and a low gate-to-source resistance can be achieved.

While in the above-described embodiment an HEMT having epitaxially grown layers in which a two-dimensional electron gas layer is formed is described, the present invention can be also applied to other semiconductor devices having epitaxially grown layers in which no two-dimensional electron gas layer is formed, for example MESFETs, with the same effects as described above.

As is evident from the foregoing description, according to the present invention, a compound semiconductor device comprises a semi-insulating compound semiconductor substrate, a plurality of epitaxial compound semiconductor layers including an InGaAs layer as an uppermost layer, disposed on the substrate, a groove penetrating through prescribed layers of the compound semiconductor layers at least including the InGaAs layer, insulating side walls disposed on the side surfaces of the groove, having parts extending outside the grove, a gate electrode deposited on the bottom of the grove and on the insulating side walls, and source and drain electrodes on the InGaAs layer at opposite sides of the grove self-aligned with the ends of the insulating side walls. Therefore, the gate-to-source distance can be shorter than the precision of the mask alignment and the gate-to-source resistance can be low. In addition, even when the electrode metal is thick, no short-circuiting occurs, resulting in a compound semiconductor device with sufficiently reduced gate electrode resistance.

According to a method for producing a compound semiconductor device of the present invention, a plurality of compound semiconductor layers including an InGaAs layer as an uppermost layer are epitaxially grown on a semi-insulating compound semiconductor substrate, first and second insulating films are deposited on the InGaAs layer, a photoresist pattern having an aperture at a gate electrode production position is formed on the second insulating film, the first and second insulating films are etched using the photoresist pattern as a mask, the second insulating film is selectively etched so that the aperture of the second insulating film is larger than the aperture of the first insulating film, a grove is formed by etching away a portion of the compound semiconductor layers using the first insulating film as a mask, a third insulating film is deposited on the side surfaces of the first and second insulating films and in the grove, the first and second insulating films are removed, and a metal deposition is performed so that a gate electrode is formed on the bottom of the grove and on the third insulating film while source/drain electrodes are formed on the InGaAs layer. The source/drain electrodes produce ohmic contact with the semiconductor layer in its non-alloyed state. As a result, a compound semiconductor device having reduced gate-to-source resistance and reduced gate electrode resistance can be produced with good yield in a simple process.

What is claimed is:

1. A compound semiconductor device comprising:
   a semi-insulating compound semiconductor substrate;
   a plurality of epitaxial compound semiconductor layers successively disposed on said substrate including an InGaAs layer as the compound semiconductor layer furthest from said substrate;
   a groove penetrating through said InGaAs layer and into at least one other of said compound semiconductor layers forming side surfaces on some of said compound semiconductor layers;
   an insulating film disposed on the side surfaces and on part of one of said compound semiconductor layers within the groove, leaving part of the compound semiconductor layer in the groove exposed, said insulating film having opposed internal surfaces generally within the groove and end parts extending beyond the groove generally parallel to and spaced from said compound semiconductor layers;
   a gate electrode disposed in the groove, on the internal surfaces of said insulating film, and directly contacting and forming a Schottky barrier with said compound semiconductor layer exposed in the groove; and
   source and drain electrodes disposed on said InGaAs layer at opposite sides of the groove respectively self-aligned with the end parts of the insulating film.

2. A compound semiconductor device in accordance with claim 1 wherein said compound semiconductor device is a high electron mobility transistor and said epitaxial compound semiconductor layers comprise a GaAs buffer layer, an n type AlGaAs layer, an n type GaAs layer, and said n type InGaAs layer, a two-dimensional electron gas being formed in the buffer layer in the vicinity of the n type AlGaAs layer.

3. A compound semiconductor device in accordance with claim 1 wherein said insulating film comprises SiN and said gate, source, and drain electrodes comprise Ti/Mo/Au.

4. A compound semiconductor device in accordance with claim 1 wherein the gate electrode is self-aligned with the end parts of the insulating film and the source and drain electrodes are in contact with said InGaAs layer.

* * * * *